US010204765B2

(12) United States Patent
Hruska

(10) Patent No.: US 10,204,765 B2
(45) Date of Patent: Feb. 12, 2019

(54) NON-THERMAL PLASMA GATE DEVICE

(71) Applicant: Pear Labs LLC, Blue Springs, MO (US)

(72) Inventor: Christopher D. Hruska, Blue Springs, MO (US)

(73) Assignee: Pear Labs LLC, Blue Springs, MO (US)

( * ) Notice: Subject to any disclaimer, the term of this patent is extended or adjusted under 35 U.S.C. 154(b) by 0 days.

(21) Appl. No.: 15/974,025

(22) Filed: May 8, 2018

(65) Prior Publication Data

US 2018/0342376 A1  Nov. 29, 2018

Related U.S. Application Data

(60) Provisional application No. 62/511,108, filed on May 25, 2017.

(51) Int. Cl.
  *H01J 37/32* (2006.01)
  *B01J 19/08* (2006.01)
  *C02F 1/30* (2006.01)

(52) U.S. Cl.
  CPC ....... *H01J 37/32348* (2013.01); *B01J 19/088* (2013.01); *C02F 1/30* (2013.01); *H01J 37/32568* (2013.01); B01J 2219/0877 (2013.01); B01J 2219/0879 (2013.01); B01J 2219/0896 (2013.01); H01J 2237/327 (2013.01)

(58) Field of Classification Search
  CPC ............... H01J 37/32; H01J 37/32348; H01J 37/32568; B01J 2219/0809; B01J 2219/0281; B01J 2219/0875; B01J 2219/0877
  See application file for complete search history.

(56) References Cited

U.S. PATENT DOCUMENTS

| | | | | |
|---|---|---|---|---|
| 6,482,368 B2 * | 11/2002 | Hemingway | ........ | B01D 53/326 204/177 |
| 7,727,489 B2 * | 6/2010 | Kondou | ............ | H01J 37/32009 422/186.04 |
| 2008/0023317 A1 * | 1/2008 | Malik | ........................ | H01J 7/24 204/164 |
| 2014/0217882 A1 * | 8/2014 | Yagi | ..................... | H05H 1/2406 313/268 |
| 2015/0255258 A1 * | 9/2015 | Nozawa | .............. | C23C 16/4584 156/345.42 |

* cited by examiner

Primary Examiner — Thai Pham
(74) Attorney, Agent, or Firm — Hovey Williams LLP

(57) ABSTRACT

A plasma gate device comprises a housing, a gas inlet, first and second dielectrics, and first, second, and third electrodes. The housing includes an internal reactor chamber. The gas inlet receives a source gas that flows to the reactor chamber. The first and second dielectrics are spaced apart from one another, with each dielectric including an upper surface and a lower surface. The two dielectrics are oriented such that the lower surface of the first dielectric faces the upper surface of the second dielectric. The first and second dielectrics form boundaries of the reactor chamber. The first electrode receives a first electric voltage. The second electrode receives a second electric voltage. The first and second electric voltages in combination generate an electric field in the reactor chamber through which the source gas flows creating a positive ion plasma and a cloud of electrons. The third electrode attracts the electrons.

20 Claims, 14 Drawing Sheets

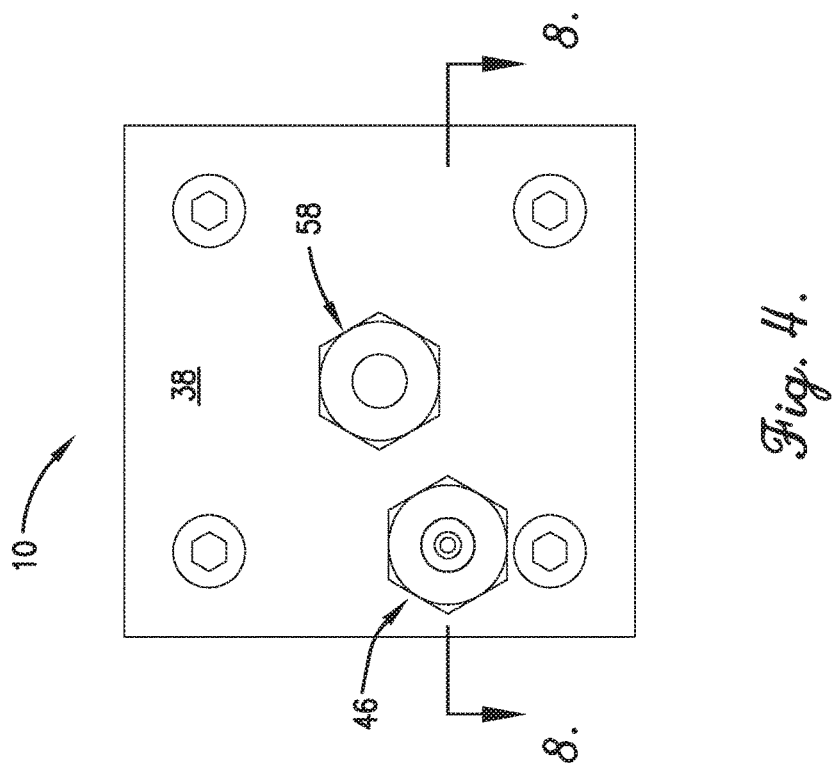
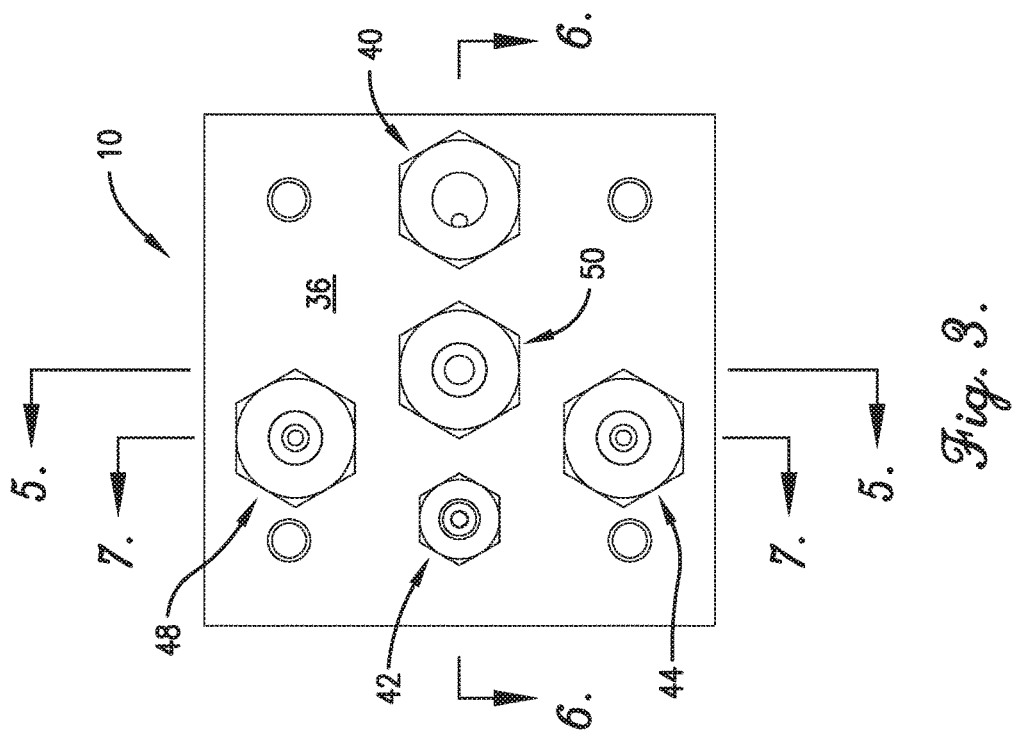

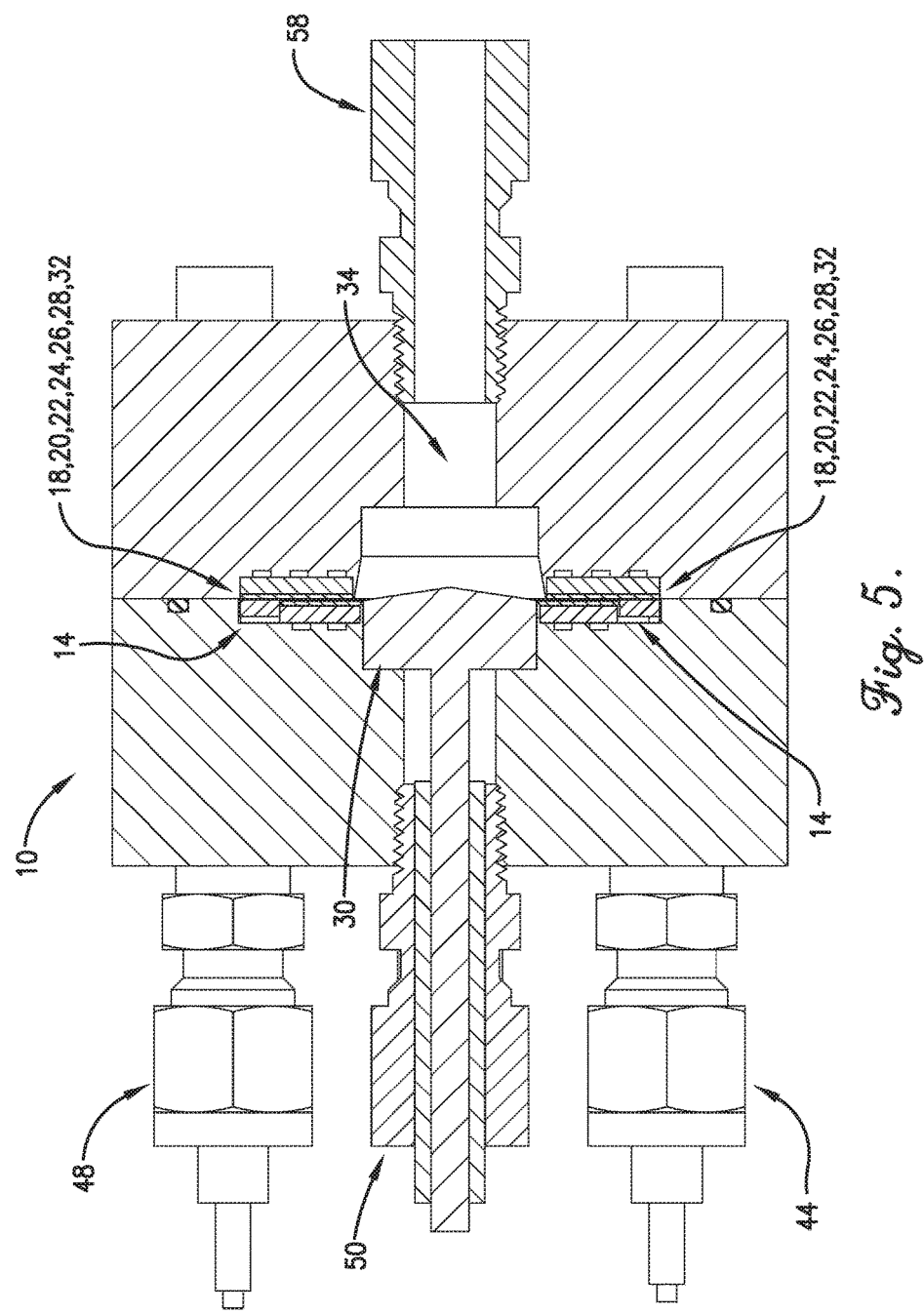

US 10,204,765 B2

NON-THERMAL PLASMA GATE DEVICE

RELATED APPLICATION

The current patent application is a non-provisional application which claims priority benefit, with regard to all common subject matter, to U.S. Provisional Application No. 62/511,108, entitled "METAL OXIDE PLASMA GATE", and filed May 25, 2017. The earlier-filed provisional application is hereby incorporated by reference in its entirety into the current application.

BACKGROUND OF THE INVENTION

Field of the Invention

Embodiments of the current invention relate to plasma gate devices.

Description of the Related Art

A plasma gate device receives at least one fluid—typically a (source) gas such as oxygen, nitrogen, etc. The plasma gate device may include at least one pair of spaced apart electrodes which generate an electric field through which the gas flows. Exposure to the electric field creates a plasma of the gas along with a cloud of electrons. The plasma generated by the plasma gate device may be directed to a liquid for applications such as nitrogen enrichment of water, purification of water, and so forth, or a solid for surface treatment of the solid as a precursor to a manufacturing process.

SUMMARY OF THE INVENTION

An embodiment of the current invention provides a plasma gate device comprising a housing, a gas inlet, a first dielectric, a second dielectric, a first electrode, a second electrode, and a third electrode. The housing includes an internal reactor chamber. The gas inlet is configured to receive a source gas that flows to the reactor chamber. The first and second dielectrics are spaced apart from one another with each dielectric including an upper surface and a lower surface. The two dielectrics are oriented such that the lower surface of the first dielectric faces the upper surface of the second dielectric, wherein the first dielectric forms an upper boundary of the reactor chamber and the second dielectric forms a lower boundary of the reactor chamber. The first electrode is in contact with the upper surface of the first dielectric, and the second electrode is in contact with the lower surface of the second dielectric. The first electrode is configured to receive a first electric voltage, while the second electrode is configured to receive a second electric voltage. The first and second electric voltages in combination generate an electric field in the reactor chamber through which the source gas flows, creating a positive ion plasma and a cloud of electrons. The third electrode is in contact with a portion of the upper surface of the second dielectric and positioned outside the electric field. The third electrode is configured to receive a third electric voltage to attract the electrons.

Another embodiment provides a plasma gate device comprising a housing, a gas inlet, a first electric power supply, a second electric power supply, a first dielectric, a second dielectric, a first electrode, a second electrode, and a third electrode. The housing includes an internal reactor chamber. The gas inlet is configured to receive a source gas that flows to the reactor chamber. The first electric power supply is configured to supply a positive electric voltage pulse and a negative electric voltage pulse. The second electric power supply is configured to supply a direct current (DC) voltage. The first and second dielectrics are spaced apart from one another with each dielectric including an upper surface and a lower surface. The two dielectrics are oriented such that the lower surface of the first dielectric faces the upper surface of the second dielectric, wherein the first dielectric forms an upper boundary of the reactor chamber and the second dielectric forms a lower boundary of the reactor chamber. The first electrode is in contact with the upper surface of the first dielectric, and the second electrode is in contact with the lower surface of the second dielectric. The first electrode is configured to receive the negative electric voltage pulse, and the second electrode is configured to receive the positive electric voltage. The positive and negative electric voltage pulses in combination generate an electric field in the reactor chamber through which the source gas flows creating a positive ion plasma and a cloud of electrons. The third electrode in is contact with a portion of the upper surface of the second dielectric and positioned outside the first electric field. The third electrode is configured to receive the DC voltage to attract the electrons.

Yet another embodiment provides a method of operating a plasma gate device including a first electrode, a second electrode, a third electrode, and a reactor chamber in proximity to the electrodes. The method comprises receiving a source gas into the reactor chamber; applying a positive electric voltage pulse to the second electrode; applying a negative electric voltage pulse, at roughly the same time as the positive electric voltage pulse, to the first electrode; applying a positive direct current (DC) electric voltage to the third electrode; applying a positive DC electric voltage to the second electrode after the positive electric voltage pulse; and applying approximately zero volts to the first electrode after the negative electric voltage pulse.

This summary is provided to introduce a selection of concepts in a simplified form that are further described below in the detailed description. This summary is not intended to identify key features or essential features of the claimed subject matter, nor is it intended to be used to limit the scope of the claimed subject matter. Other aspects and advantages of the current invention will be apparent from the following detailed description of the embodiments and the accompanying drawing figures.

BRIEF DESCRIPTION OF THE DRAWING FIGURES

Embodiments of the current invention are described in detail below with reference to the attached drawing figures, wherein:

FIG. 3 is an elevational view of the first end of the housing of the plasma gate device;

FIG. 4 is an elevational view of the second end of the housing of the plasma gate device;

FIG. 5 is a cross-sectional view of the plasma gate device cut along the line 5-5 of FIG. 3, illustrating a plurality of dielectrics and a plurality of electrodes;

Figure 1:
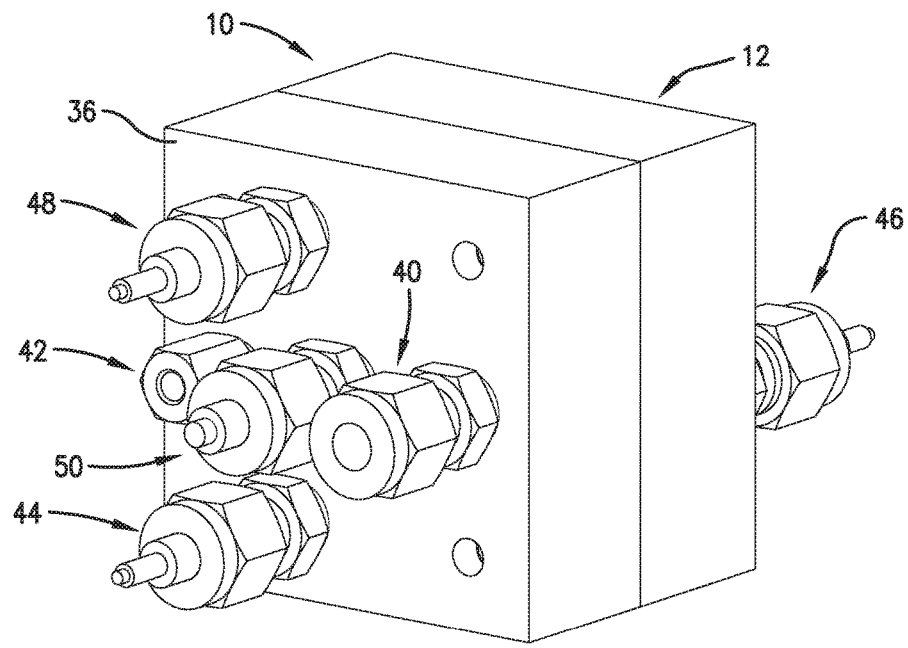
FIG. 1 is a perspective view of a first end of a plasma gate device, constructed in accordance with various embodiments of the current invention, illustrating a housing with a plurality of electrode connectors and a plurality of gas inlet connectors.
Figure 2:
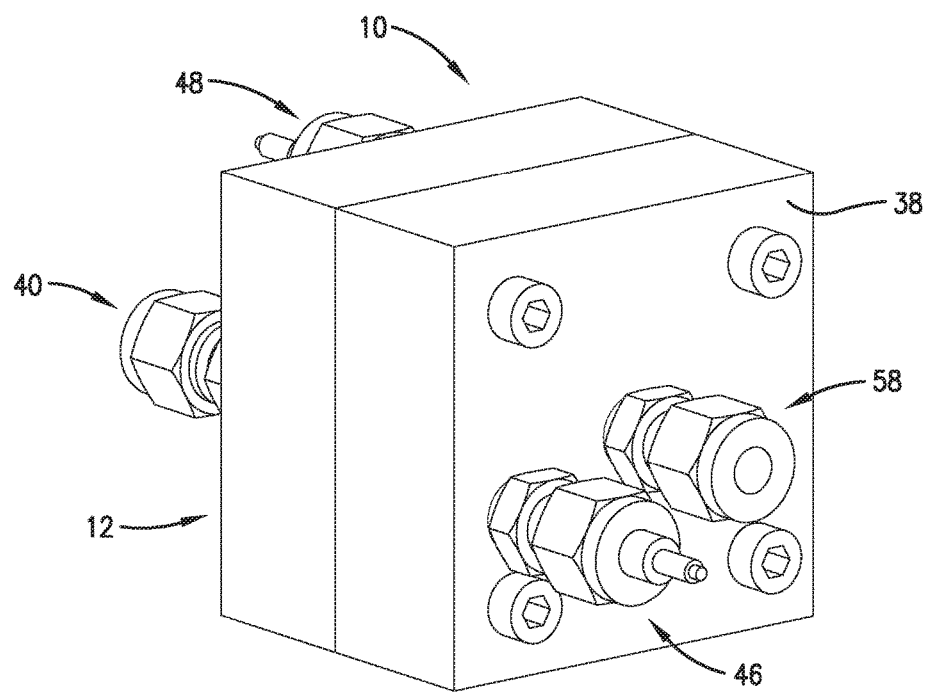
FIG. 2 is a perspective view of a second, opposing end of the plasma gate device, illustrating the housing with an electrode connector and a gas outlet connector.

The drawing figures do not limit the current invention to the specific embodiments disclosed and described herein. While the drawings do not necessarily provide exact dimensions or tolerances for the illustrated components or structures, the drawings are to scale as examples of certain embodiments with respect to the relationships between the components of the structures illustrated in the drawings.

DETAILED DESCRIPTION OF THE EMBODIMENTS

The following detailed description of the invention references the accompanying drawings that illustrate specific embodiments in which the invention can be practiced. The embodiments are intended to describe aspects of the invention in sufficient detail to enable those skilled in the art to practice the invention. Other embodiments can be utilized and changes can be made without departing from the scope of the present invention. The following detailed description is, therefore, not to be taken in a limiting sense. The scope of the present invention is defined only by the appended claims, along with the full scope of equivalents to which such claims are entitled.

In this description, references to "one embodiment", "an embodiment", or "embodiments" mean that the feature or features being referred to are included in at least one embodiment of the technology. Separate references to "one embodiment", "an embodiment", or "embodiments" in this description do not necessarily refer to the same embodiment and are also not mutually exclusive unless so stated and/or except as will be readily apparent to those skilled in the art from the description. For example, a feature, structure, act, etc. described in one embodiment may also be included in other embodiments, but is not necessarily included. Thus, the current technology can include a variety of combinations and/or integrations of the embodiments described herein.

A plasma gate device 10, constructed in accordance with various embodiments of the current invention, is shown in FIGS. 1-8. The plasma gate device 10 may broadly comprise a housing 12, a gas inlet 14, a gas bypass inlet 16, a first dielectric 18, a second dielectric 20, a third dielectric 22, a first electrode 24, a second electrode 26, a third electrode 28, a fourth electrode 30, a reactor chamber 32, and a gas outlet 34. The plasma gate device 10 may also comprise a plurality of gaskets or seals, such as O-ring seals, that are positioned at the interfaces between various components of the device 10. The plasma gate device 10 generally receives a gas as an input and provides a plasma or effluent as an output. The terms "upstream" and "downstream" may be used hereinafter to describe relative directions or positionings with regard to the flow of gases and plasma utilized or produced by the plasma gate device 10. Upstream generally refers to a direction opposing the flow, while downstream generally refers to a direction coinciding with, or corresponding to, the flow. In addition, terms such as "upper", "lower", "outer", "inner", etc. may be used with their traditional meanings to describe relative positionings of various components of the invention. The terms may be used in reference to the figures and the orientations of components therein. The components may be oriented in other ways and thus, the terms do not limit the scope of the claimed invention.

The housing 12, best seen in FIGS. 1-4, generally retains the components of the plasma gate device 10. In exemplary embodiments, the housing 12 may be mostly solid, except for the voids described below, and may have a box shape with a first end surface 36, a second end surface 38, and four side surfaces. The housing 12 may be formed from metals, plastics, ceramics, or the like. In some embodiments, the housing 12 may include a plurality of separately constructed sections which are assembled to form the housing 12. The sections may be held together with fasteners, such as screws. The housing 12 includes a center-line axis which extends from a center point of the first end surface 36 to a center point of the second end surface 38.

The gas inlet 14, as shown in FIGS. 1, 3, 6, 9, and 12, generally receives a source gas from an external source. The source gas is typically a fluid such as a low density gas, such as oxygen, nitrogen, etc., although in some cases, the source gas may be a fluid such as a liquid or material in a liquid state. The gas inlet 14 includes an opening in the first end surface 36 which couples to one or more channels or passageways that lead to the reactor chamber 32. The gas inlet 14 may couple to attachments, connectors, fittings, couplers, or so forth, such as a gas inlet connector 40 on the first end surface 36. The gas inlet connector 40 may couple to an external gas source to receive the source gas. The source gas flows through the gas inlet 14 to the reactor chamber 32.

Figure 6:
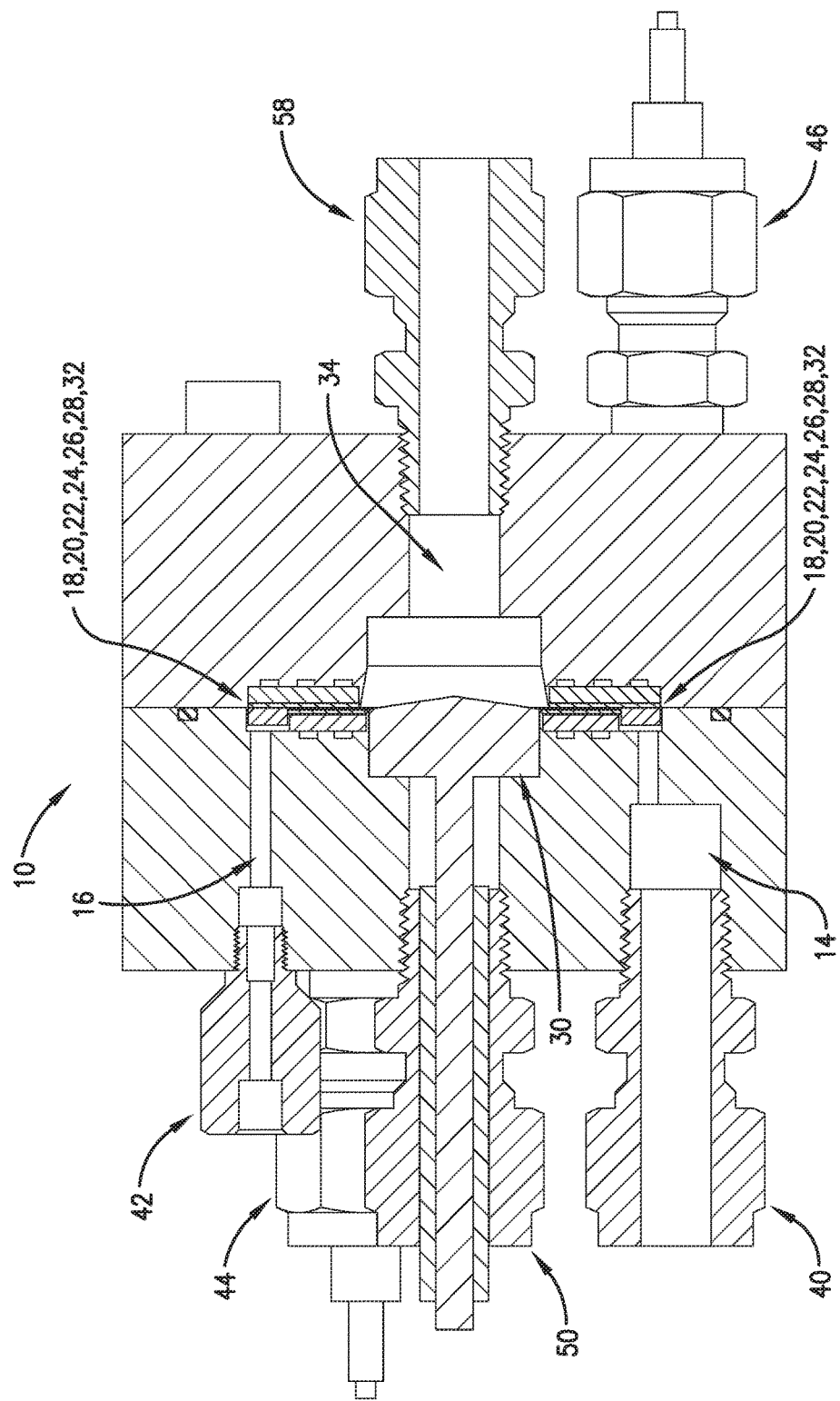
FIG. 6 is a cross-sectional view of the plasma gate device cut along the line 6-6 of FIG. 3, illustrating a gas inlet and a gas bypass inlet.
Figure 7:
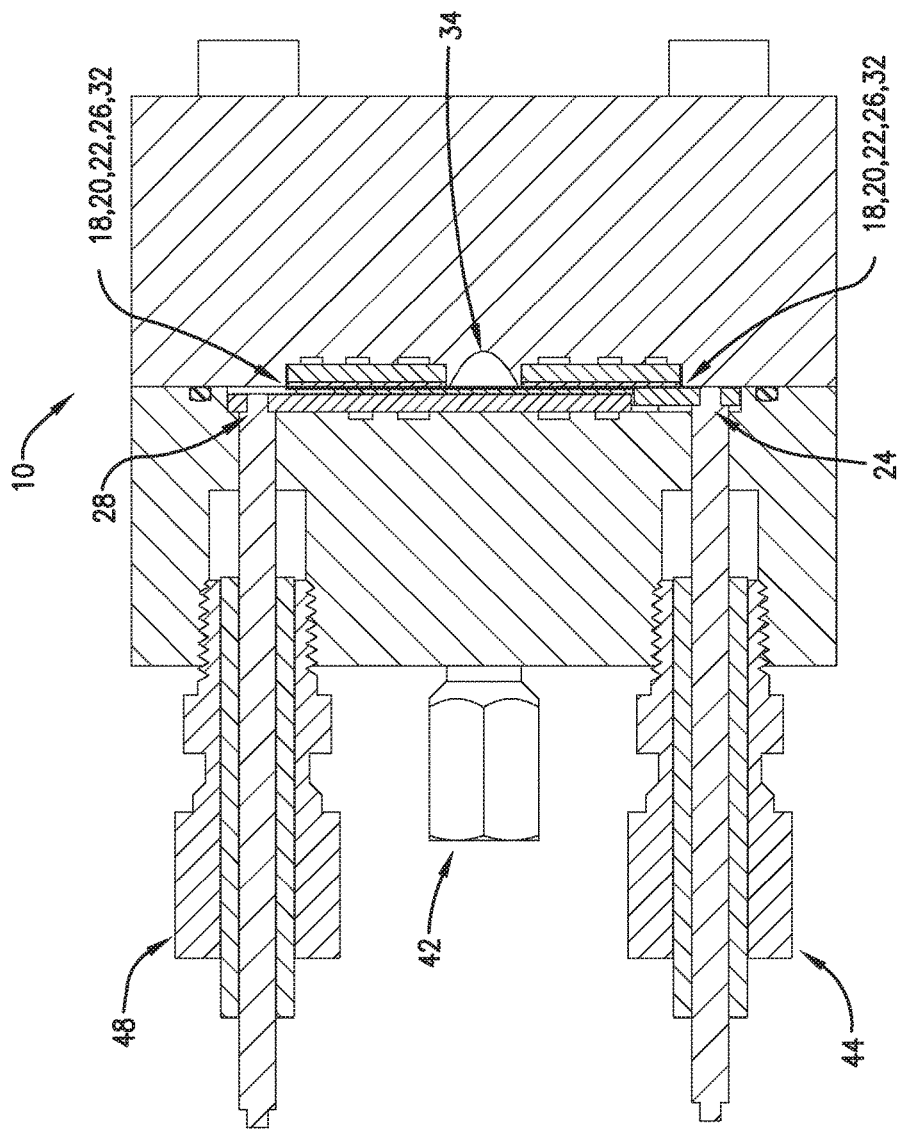
FIG. 7 is a cross-sectional view of the plasma gate device cut along the line 7-7 of FIG. 3, illustrating the connection of connectors to electrodes.
Figure 8:
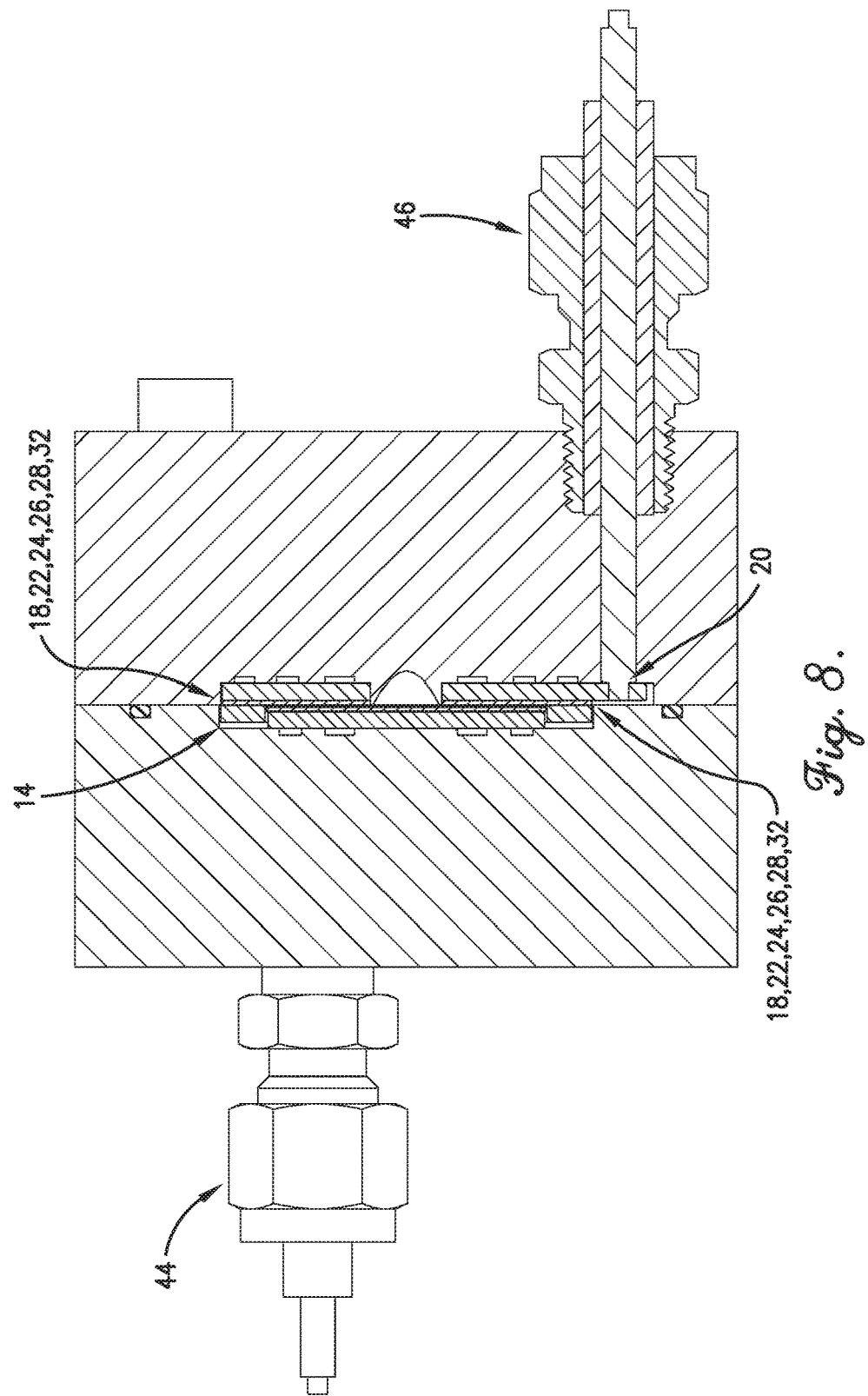
FIG. 8 is a cross-sectional view of the plasma gate device cut along the line 8-8 of FIG. 4, illustrating the connection of another connector to another electrode.
Figure 9:
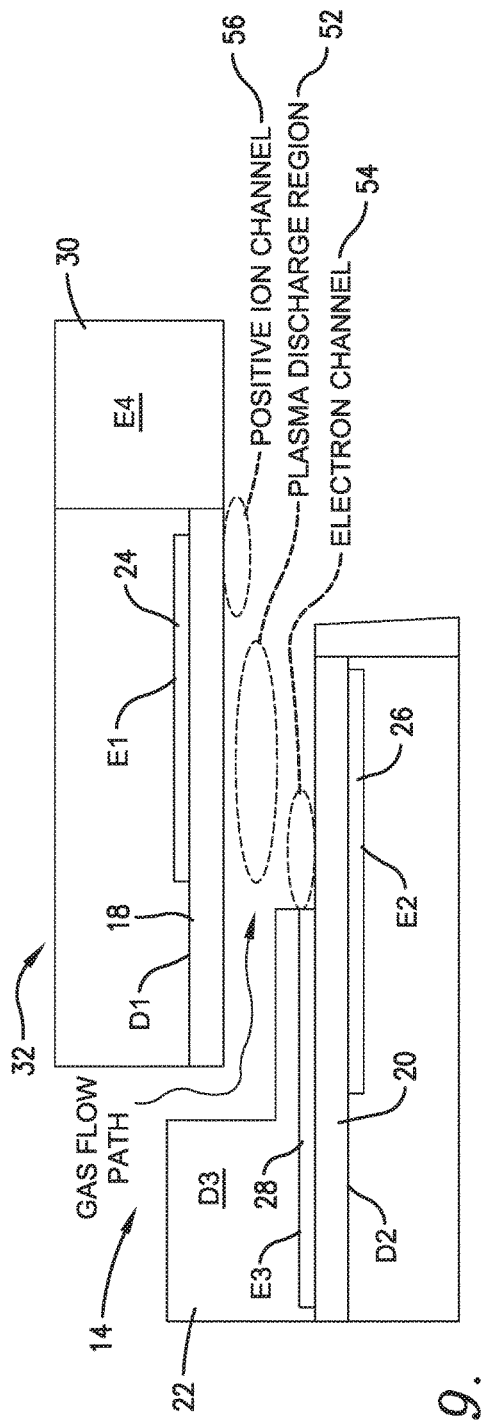
FIG. 9 is a schematic block diagram of various components associated with a reactor chamber including a plurality of dielectrics and a plurality of electrodes.

The gas bypass inlet 16, as shown in FIGS. 1, 3, and 6, generally receives atmospheric, ambient gas from the air in the vicinity of the plasma gate device 10. The gas bypass inlet 16 includes an opening in the first end surface 36 which couples to one or more channels or passageways that lead to the reactor chamber 32. The gas bypass inlet 16 may couple to attachments, connectors, fittings, couplers, or so forth, such as a gas bypass inlet connector 42 on the first end surface 36. Internally, the gas bypass inlet 16 intersects and combines with the gas inlet 14 upstream from the reactor chamber 32.

The first, second, and third dielectrics 18, 20, 22, as shown in FIGS. 5-9 and 12, are each formed from non-conductive materials, such as plastics, ceramics, or other dielectric materials, with a high dielectric strength and a high electrical permittivity. In exemplary embodiments, the first and second dielectrics 18, 20 are each generally annular, disc-shaped with a central opening forming an inner diameter and a larger outer diameter. The inner diameter of the first dielectric 18 is smaller than the inner diameter of the second dielectric 20. And, the outer diameter of the first dielectric 18 is smaller than the outer diameter of the second dielectric 20. Each dielectric 18, 20, 22 also includes an upper surface and a lower surface. In exemplary embodiments, the third dielectric 22 is also generally annular, disc-shaped with a central opening forming an inner diameter and a larger outer diameter. The third dielectric 22 includes an upper surface and a lower surface with a shoulder formed on the upper surface adjacent to an outer edge thereof. The three dielectrics 18, 20, 22 are positioned within the housing 12 such that a center of each dielectric 18, 20, 22 lies along the center-line axis. The first and second dielectrics 18, 20 are positioned spaced apart from one another such that a portion of the first dielectric 18 overlaps a portion of the second dielectric 20. In addition, the lower surface of the first dielectric 18 faces the upper surface of the second dielectric 20. The space between the first dielectric 18 and the second dielectric 20 may have a gap distance ranging from approximately 0.002 inches to approximately 0.015 inches. The inner portion of the third dielectric 22 is positioned in the space between the first dielectric 18 and the second dielectric 20. The outer portion of the third dielectric 22, including the shoulder, is positioned over the second dielectric 20 and outward from the first dielectric 18.

The first, second, and third electrodes 24, 26, 28 are each formed from electrically conductive material including metals such as copper, gold, silver, aluminum, nickel, or the like, or alloys thereof. In exemplary embodiments, the first, second, and third electrodes 24, 26, 28 are formed as traces or planes of electrically conductive material on one surface of a printed circuit board—wherein the printed circuit board is formed from insulating or dielectric material, such FR4. In other embodiments, the first, second, and third electrodes 24, 26, 28 may each be formed from thick film metal deposited on ceramic, such as low temperature cofired ceramic (LTCC) or the like. In alternative embodiments, the first, second, and third electrodes 24, 26, 28 may each be thin sheets of metal shaped and positioned as described below.

Each electrode 24, 26, 28 electrically connects to attachments, connectors, fittings, couplers, or so forth in order to receive an electronic signal from an electrical power supply. The first electrode 24 may electrically connect to a first electrode connector 44 which is mechanically connected to the first end surface 36. The second electrode 26 may electrically connect to a second electrode connector 46 which is mechanically connected to the second end surface 38. The third electrode 28 may electrically connect to a third electrode connector 48 which is mechanically connected to the first end surface 36.

In exemplary embodiments, each electrode 24, 26, 28 is generally planar, annular, disc-shaped with a central opening forming an inner diameter and a larger outer diameter. The inner diameter of the first electrode 24 is smaller than the inner diameter of the second electrode 26, and the outer diameter of the first electrode 24 is smaller than the outer diameter of the second electrode 26. The inner diameter of the second electrode 26 is smaller than the inner diameter of the third electrode 28, and the outer diameter of the second electrode 26 is smaller than the outer diameter of the third electrode 28.

The first, second, and third electrodes 24, 26, 28 are positioned within the housing 12 such that a center of each electrode 24, 26, 28 lies along the center-line axis. The first electrode 24 is positioned in contact with the upper surface of the first dielectric 18. The second electrode 26 is positioned in contact with the lower surface of the second dielectric 20. The third electrode is positioned in contact with the upper surface of the second dielectric 20. The first electrode 24 is spaced apart from the second electrode 26, and a portion of the first electrode 24 overlaps a portion of the second electrode 26. The third electrode 28 is positioned in the space between the first electrode 24 and the second electrode 26. A portion of the third electrode 28 overlaps a portion of the second electrode 26—radially outward from the first electrode 24 overlap such that there is no overlap of the first electrode 24 and the third electrode 28.

In exemplary embodiments, the fourth electrode 30, as shown in FIGS. 5, 6, 9, and 12, is formed from electrically conductive material including metals such as copper, gold, silver, aluminum, nickel, or the like, or alloys thereof. The fourth electrode 30 is generally disc-shaped with an upper surface and a lower surface, wherein the lower surface may have a conical shape with an apex extending downward. The fourth electrode 30 electrically connects to attachments, connectors, fittings, couplers, or so forth in order to receive an electronic signal from an electrical power supply. The fourth electrode 30 may electrically connect to a fourth electrode connector 50 which is mechanically connected to the first end surface 36. The fourth electrode 30 is positioned along the center-line axis of the housing 12, which places the fourth electrode 30 adjacent to, and inward from, the first dielectric 18 and the first electrode 24.

The reactor chamber 32, as shown in FIGS. 5, 6, 9, and 12, generally provides a space where plasma of the source gas is created. The lower surface of the first dielectric 18 forms an upper boundary of the reactor chamber 32, while the upper surface of the second dielectric 20 forms a lower boundary of the reactor chamber 32. A first end, or entry, of the reactor chamber 32 couples with the gas inlet 14, while a second opposing end, or exit, couples with the gas outlet 34. Positioned within the reactor chamber 32 are a plasma discharge region 52, an electron channel 54, and a positive ion channel 56. The plasma discharge region 52 is the space where a (positive ion) plasma of the source gas is created as a result of electrons being stripped from the gas molecules and charge separation occurs. The electron channel 54 is the space where electrons stripped from the source gas may collect. The positive ion channel 56 is the space where the plasma may be guided.

The gas outlet 34, as shown in FIGS. 2 and 4-6, generally receives the ejected plasma ions from the positive ion channel and provides a path for them to flow out of the plasma gate device 10. Just before, or within the gas outlet 34, the plasma ions may be mixed with, combined with, or introduced to another gas, a liquid, or a solid which creates an effluent. The gas outlet 34 is defined by an internal cavity along the center-line axis of the housing 12. The gas outlet 34 may couple to attachments, connectors, fittings, couplers, or so forth, such as a gas outlet connector 58 on the second end surface 38. The gas outlet connector 58 may couple to an external destination which receives the effluent.

Figure 10:
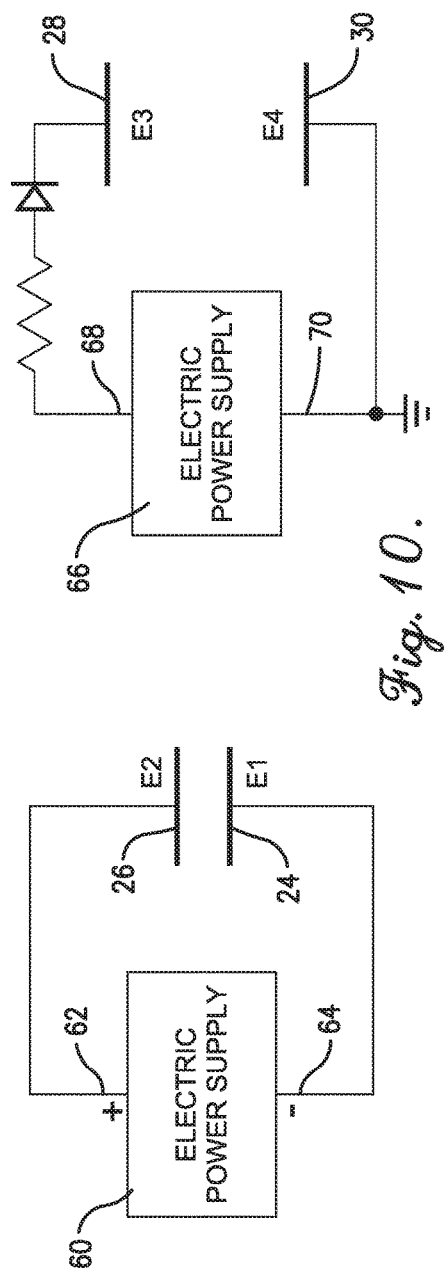
FIG. 10 is a schematic block diagram of first and second electric power supplies electrically connected to various electrodes.

Various electrical power sources and electrical circuitry, as shown in FIG. 10, may be utilized with the plasma gate device 10. The electrical power sources may be part of the current invention or they may be external to the current invention. In an exemplary embodiment, a first electric power supply 60 may provide electric voltage and/or electric current and may include a first terminal 62 and a second terminal 64. The first electric power supply 60 may generate a series of positive voltage and/or current pulses at the first terminal 62 and a series of negative voltage and/or current pulses at the second terminal 64. Each positive voltage and/or current pulse may be synchronized to occur at roughly the same time as a successive one of the negative voltage and/or current pulses. Each voltage and/or current pulse may have a pulse width on the order of approximately 100 nanoseconds (ns) and may be generated every approximately 200 ns to approximately 1 millisecond (ms)—yielding a pulse frequency of approximately 1 kilohertz (kHz) to approximately 5 MHz. The first electric power supply 60 may also generate a direct current (DC) voltage and/or current that is either positive or negative at the first terminal 62, the second terminal 64, or both terminals 62, 64. The first terminal 62 may be electrically connected to the second electrode 26 (through the second electrode connector 46). The second terminal 64 may be electrically connected to the first electrode 24 (through the first electrode connector 44). An exemplary embodiment of the first electric power supply 60 is also described in U.S. patent application Ser. No. 15/664,423, entitled "DEVICE AND METHOD FOR GENERATING A HIGH VOLTAGE PULSE", and filed Jul. 31, 2017. The referenced patent application is hereby incorporated by reference into the current patent application in its entirety.

A second electric power supply 66 may provide electric voltage and/or electric current and may include a first terminal 68 and a second terminal 70. The second electric power supply 66 may generate a DC voltage and/or current that is either positive or negative at the first terminal 68, the second terminal 70, or both terminals 68, 70. The first terminal 68 is electrically connected to a resistor in series with the anode of a diode. The cathode of the diode is electrically connected to the third electrode 28 (through the third electrode connector 48). The second terminal 70 is electrically connected to electrical ground and to the fourth electrode 30 (through the fourth electrode connector 50).

Figure 11:
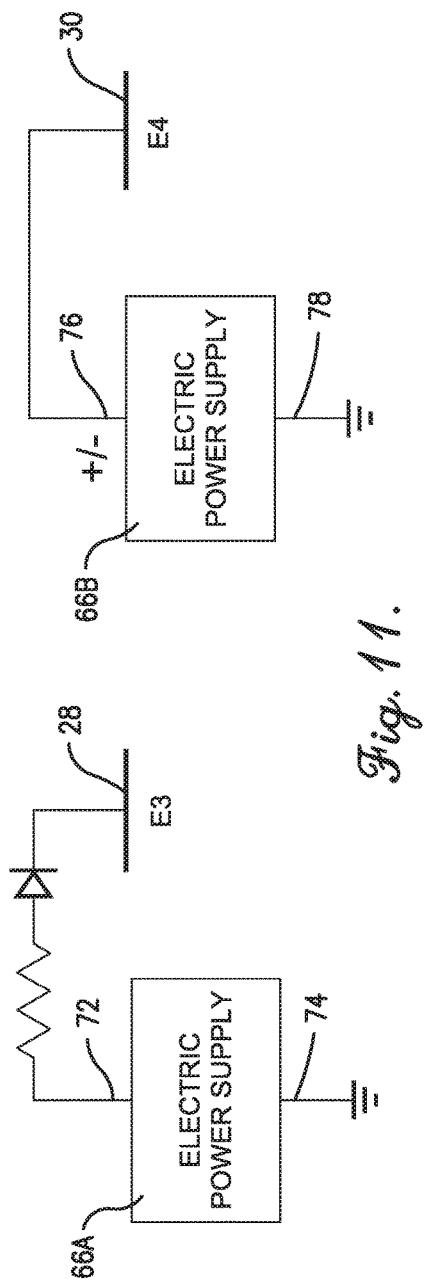
FIG. 11 is a schematic block diagram of an alternative embodiment of the second electric power supply.

In alternative embodiments shown in FIG. 11, the third electrode 28 and the fourth electrode 30 may be electrically connected to separate electric power supplies. For example, one electric power supply 66A may include a first terminal 72 electrically connected to the resistor in series with the diode in series with the third electrode 28 and a second terminal 74 electrically connected to electrical ground. Another power supply 66B may include a first terminal 76 electrically connected to the fourth electrode 30 and a second terminal 78 electrically connected to electrical ground. Each of the electric power supplies 66A, 66B may generate a DC voltage and/or current that is either positive or negative at the first terminal 72, 76, the second terminal 74, 78, or both terminals 72, 74, 76, 78.

The plasma gate device 10 may operate as follows. The source gas may be supplied from an external source and is received by the gas inlet 14. The source gas may be supplied at approximately atmospheric pressure, below atmospheric pressure, or may be pressurized. The source gas may flow through the gas inlet 14 toward the reactor chamber 32.

Figure 12:
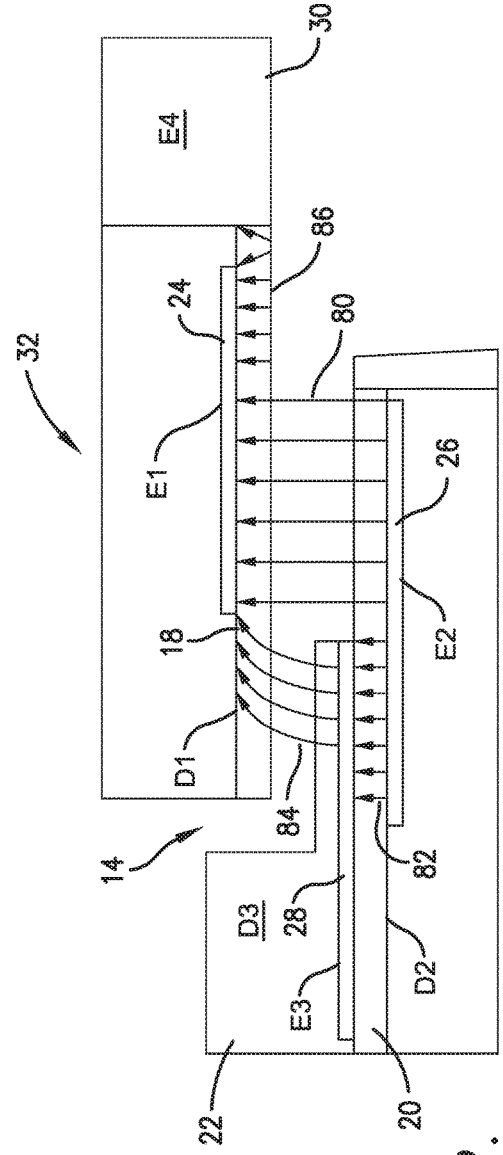
FIG. 12 is a schematic block diagram of various components associated with the reactor chamber of the plasma gate device further illustrating a plurality of electric fields.

Referring to FIG. 12, a plurality of electric fields generated by the voltages applied to the various electrodes 24, 26, 28 are shown. A first electric field 80 is formed between the first electrode 24 and the second electrode 26. A second electric field 82 is formed between the second electrode 26 and the third electrode 28. A third electric field 84 is formed between the first electrode 24 and the third electrode 28. A fourth electric field 86 is formed at the first electrode 24 adjacent to the fourth electrode 30.

Figure 13:
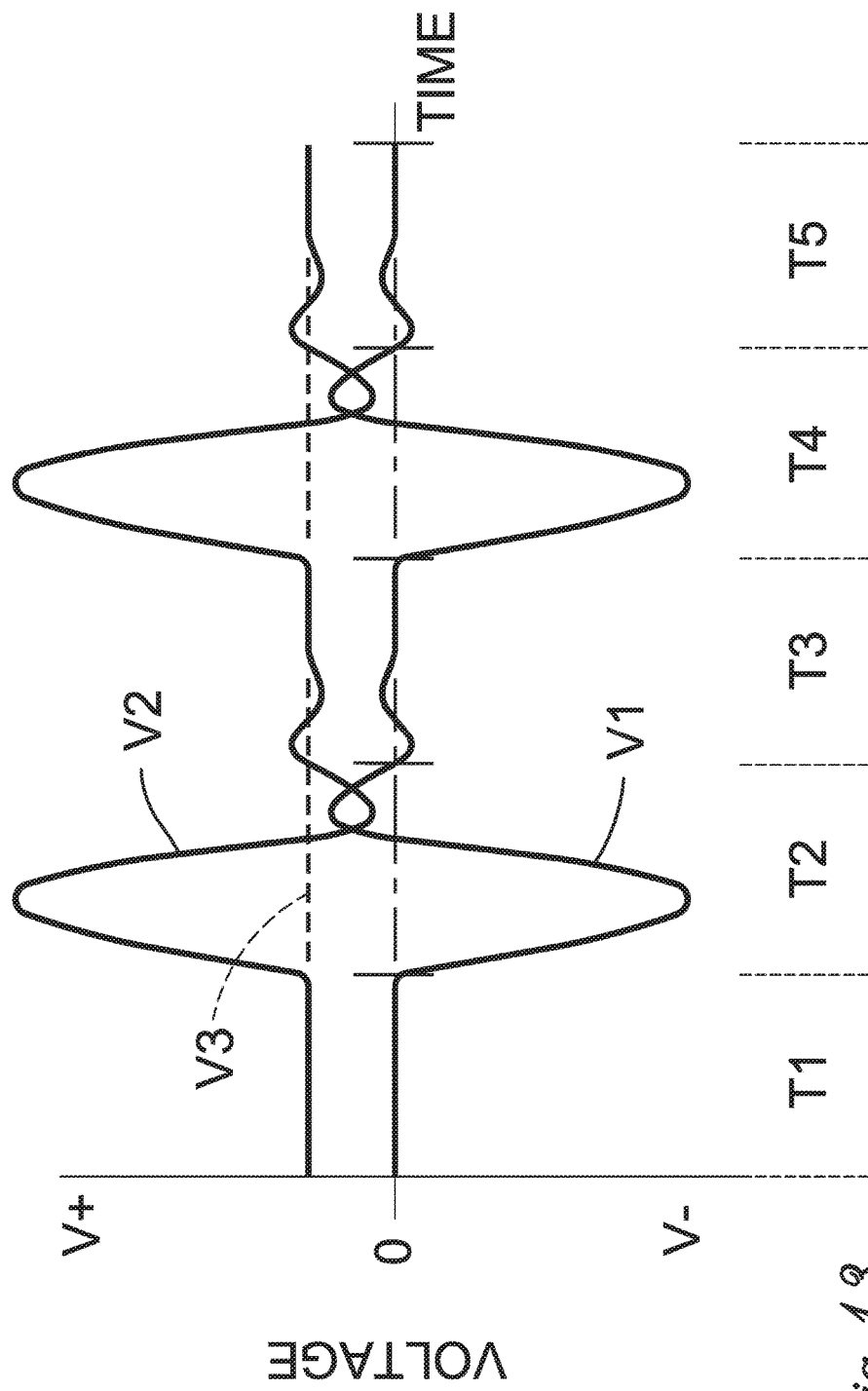
FIG. 13 is a plot of voltage versus time for voltages applied to various electrodes.

Referring to FIG. 13, a plot of voltage versus time illustrates voltages applied to the first, second, and third electrodes 24, 26, 28 for a plurality of time periods during a process of generating plasma from a source gas. As shown in FIG. 13, the voltage applied to the first electrode 24 is labeled "V1" and is supplied by the first electric power supply 60. The voltage applied to the second electrode 26 is labeled "V2" and is supplied by the first electric power supply 60. The voltage applied to the third electrode 28 is labeled "V3" and is supplied by the second electric power supply 66. The voltage for the fourth electrode 30 is not shown in the plot of FIG. 13 because in exemplary embodiments, the fourth electrode 30 is electrically connected to electrical ground and has an electric voltage value of 0 Volts. First through fifth time periods are labeled "T1" through "T5", respectively. Although the time periods T1 through T5 are shown in FIG. 13 as being roughly equal, each time period may be of a different length.

During the time period T1, voltage V1 is equal to approximately zero volts. Voltages V2 and V3 are equal to a positive DC value. As a result of voltages V1 and V2, the intensity of the first electric field 80 may be established at a minimum constant level. As a result of voltages V1 and V3, the intensity of the second electric field 82 may also be established at a minimum constant level, but perhaps less than the intensity of the first electric field 80. Given that the voltages V2 and V3 are equal, the intensity of the third electric field 84 is roughly zero. The intensity of the fourth electric field 86 may be roughly zero given the absence of charged particles, such as the plasma, in the area of the intersection of the first electrode 24 and the fourth electrode 30. A certain volume of the source gas flows into the reactor chamber 32.

During the time period T2, voltage V2 receives a high amplitude, short time period positive voltage pulse, while voltage V1 receives a high amplitude, short time period negative voltage pulse. Voltage V3 is held at the positive DC value as in the time period T1. Given the positive and negative voltage pulses, the intensity of the first electric field 80 increases dramatically in a pulse as well, which may strip electrons off of the atoms and/or molecules of the source gas—resulting in the formation of a positive ion plasma and a cloud of free electrons. After the pulse occurs, the plasma may remain in the plasma discharge region 52, while the free electrons may drift to the electron channel 54. The electron mobility in the reactor chamber 32 is much higher than the ion mobility. The free electrons may be drawn to the electron channel 54 by the positive DC voltage V3 applied to the third electrode 28. As at least a portion of the third electrode 28 is exposed to the free electrons in the electron channel 54, the free electrons may actually flow into the third electrode 28 and be drawn into the external circuit associated with electric power supply 66 during the very short pulse time. The slower moving ions will eventually drift toward the first dielectric 18 and form or enhance the positive ion channel 56. This positive ion channel 56 will persist after time period T2 because there remain too few electrons in the reactor chamber 32 to neutralize the plasma cloud after time period T2 ends. This action results in an excess of positive ion charge remaining in reaction chamber 32 during time period T3.

During the time period T3, voltages V1 and V2 are allowed to return to their values from time period T1. That is, voltage V1 returns to a value of approximately zero volts, while voltage V2 returns to a positive DC value. Voltage V3 remains at the same positive DC value it has been at for time periods T1 and T2. Residual electrons accumulated on the surface of the second dielectric 20 will disperse by either flowing into the third electrode 28 or moving toward the positive ion channel 56. The fourth electrode 30 remains electrically grounded. The positive ions of the plasma then pass through the positive ion channel 56 as they are pushed away from each other by coulomb forces as well as by the second and third electrodes 26, 28 (given the positive charge of the electrodes 26, 28) and drawn toward the fourth electrode 30—encountering the fourth electric field 86. The positive ions of the plasma may drift out of the gas outlet 34. Or, they may be guided toward a target, such as a solid, a liquid, or another gas. This outflow of charge particles may create a pressure differential along the plasma discharge region 52.

Time periods T4 and T5 generally repeat the process that occurred in time periods T2 and T3. That is, a high amplitude, short period pulse is applied to the first and second electrodes 24, 26 which ionizes the source gas that has flowed into the reactor chamber 32 to repeatedly generate plasma and separate charges in the reactor chamber 32. The positive and negative charges separate, with the electrons flowing toward the electron channel 54 and into the third electrode 28 and the positive ions transitioning from the plasma discharge region 52 toward the positive ion channel 56. And the process continues, with the actions of time periods T2 and T3 occurring repeatedly, creating a sequence of electric voltage pulses that are applied as desired or indefinitely. In between the pulses, DC voltages may be applied.

In some embodiments, the third electrode 28 may have a negative DC voltage applied to it at all times—instead of the positive voltage discussed above. In such embodiments, the third electrode 28 would source, supply, or emit electrons into the electron channel 54. During time period T2 when plasma of the source gas is generated, the electrons may be infused into the plasma creating a negative ion plasma. During time period T3 and other times, the fourth electrode 30 may have a positive DC voltage applied to it so that it attracts the negative ion plasma.

The following describes some features of the current invention. In some embodiments, ambient, atmospheric air may be pumped in, or may flow in, to the gas bypass inlet 16 such that oxygen may be separated from the air—providing concentrated or enriched oxygen as an output of the plasma gate device 10. A fundamental aspect of the technology is that once charge separation is achieved in the plasma, the negative and positively charged carriers not only have very different mobilities within the plasma/gas, but that the negatively charged electrons may be adsorbed onto conduction surfaces, such as the third electrode 28, and move into and through those surfaces while the ions cannot. The ions, regardless of their charge are confined to the plasma and the surfaces available in and around the plasma, such as the plasma discharge region 52 and the positive ion channel 56 within the reactor chamber 32. This technology recognizes that difference and exploits it.

It should be recognized that free electrons in general are extremely short lived. They will accumulate at the reactor chamber 32 surfaces or on the surfaces of neutral particles in the region very rapidly as their mass is so small and velocity so high that they can move to the most favorable (low energy) sites in extremely short time periods (picoseconds). In addition, once absorbed onto a conduction surface, they become part of the free electron cloud in that material that will allow their effective charge to move as an electromagnetic wave near the speed of light.

Once in the conduction band of a metal, the excess electrons are "bound" by the lower energy state associated with that cloud and are no longer "free" to flow out of the conductor, such as the third electrode 28, as readily. In is way, the conductor surface in contact with the excess electron charge of the non-thermal plasma can act like a diode in the sense that electrons are free to move into the material, such as the third electrode 28, but not so free to move out. As a practical matter, transmission of the electron charge out of the conductor at low temperature requires contact with other particles, either neutral fluid particles or positively charged fluid particles that they can hop to from the conductor. Since those larger atoms/molecules move much slower at the low temperature involved here, there is opportunity for the applied electric pulses to manipulate the electrons faster than the other materials can react. This is a fundamental aspect of the operation of the plasma gate device 10 and one that future work will hopefully lead to a broader range of application.

By attending to the various surface areas, i.e., making the exposed conduction areas, such as the end surface of the third electrode 28 which is exposed to the reactor chamber 32, small relative to the plasma discharge area, this technology exploits the differences in the nature of the electrical charge-seeking to provide ample opportunity for the fast moving electrons to move out from the discharge cloud to the end surface of the third electrode 28, and charging the third electrode 28 (like a positive-charging electrode stripline capacitor during the very short plasma discharge generating pulse), and then trapping the electrons there as that pulse ends and the electric field on that built-in capacitor (created by the overlap of the second electrode 26 and the third electrode 28 and having the second electric field 82) changes. This collapse of the charging pulse then directs the stored charge in the that capacitor to flow out through the external conductors and the second electric power supply 66.

This "built-in" diode action for the excess electrons generated in the plasma discharge is then transformed into a similar diode action acting to disperse the accumulated positive charge remaining in the discharge gap after the plasma generating pulse ends. As a result, the device when driven properly, behaves like a "pulsed ion pump" or "pulsed ion compressor, analogous to a simple diaphragm pump. Here, the "check valve action" needed to make the flow one directional in a simple diaphragm pump is provided by the mechanisms described above. The result is this "check valve action" finally being provided by the attraction/repulsion forces of the charged particles in the changing electric field. Once the charge is separated, the additional "compression power" is provided by the DC drift field which remains after the plasma discharge pulse has ended and acts on the excess stranded positive charge in the discharge gap to sweep it out or "compress" it.

Because the actual plasma generating pulse is very short (~100 nS), the Pulse Firing Frequency (PFF) can still be very high and is only limited by the power handling capability of the pulse power supply, the delay time required after the firing pulse ends for recovery of the external transformer, and the time it takes for the stranded ions to be swept out of the plasma firing zone. This is typically a relatively short time—on the order of 200-300 nS. So it is reasonable to expect to drive the PFF up to the 3-5 MHz range. This is fast enough to result in the compression of significant quantities of ions on a grams per minute scale, even though the amount of charge pumped in each cycle is relatively small.

Figure 14:
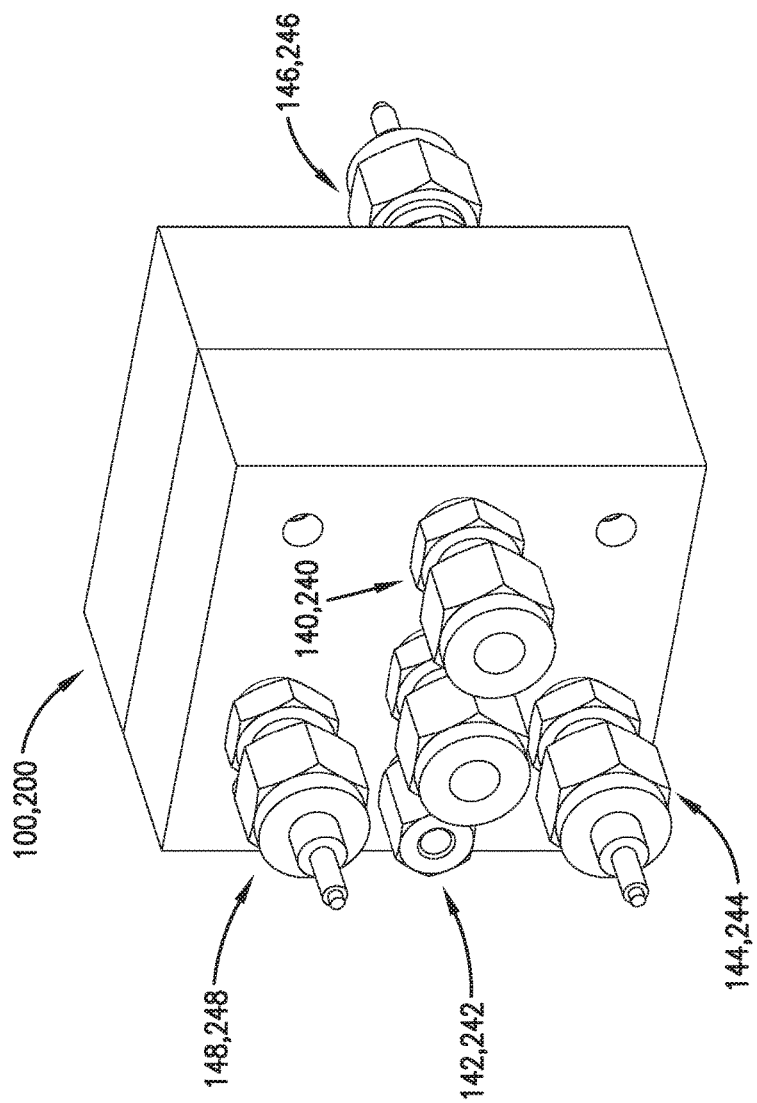
FIG. 14 is a perspective view of a first end of another embodiment of the plasma gate device, the device excluding one of the electrodes and its connector.
Figure 15:
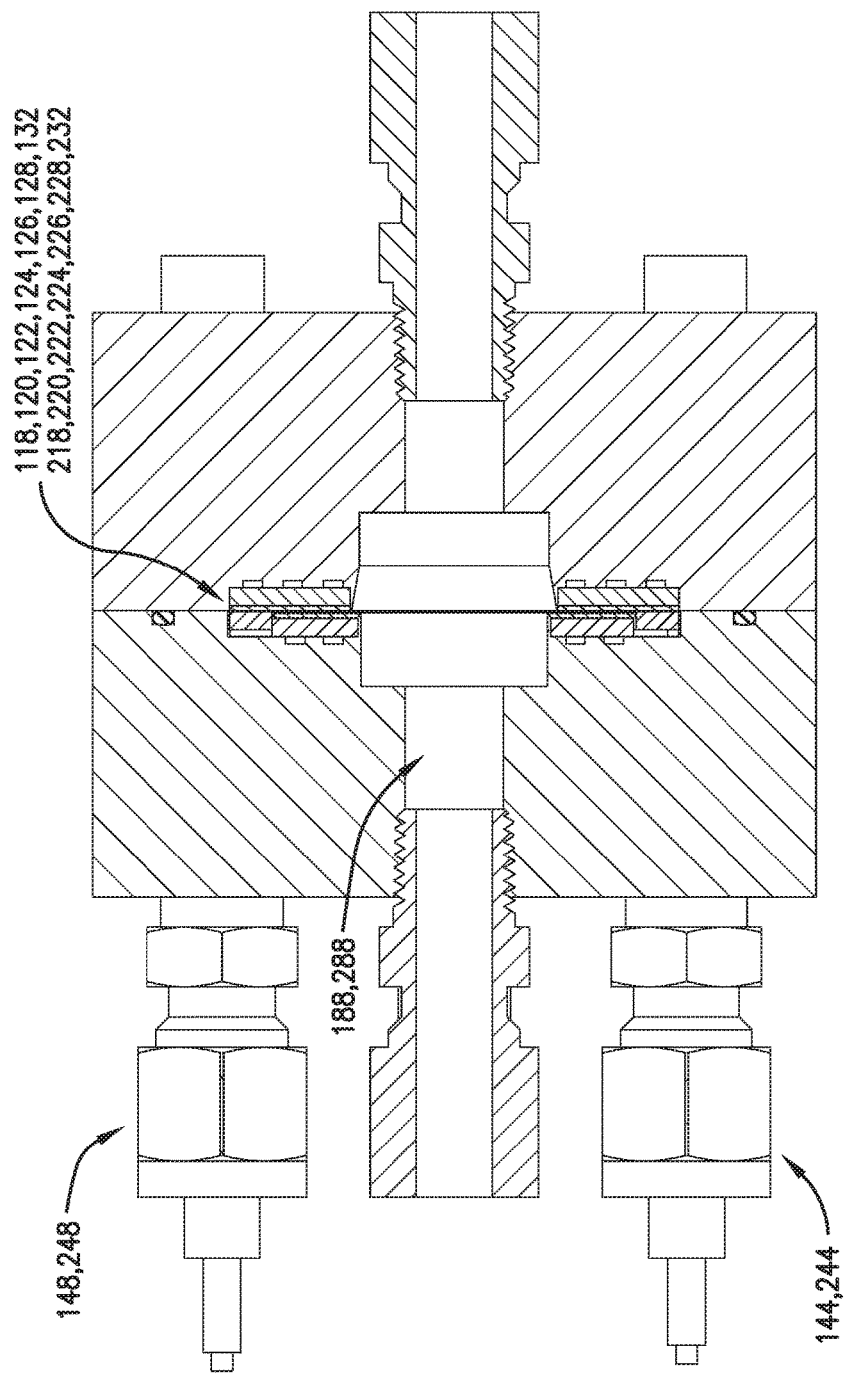
FIG. 15 is a cross-sectional view of the plasma gate device of FIG. 14 cut along a central vertical plane.
Figure 16:
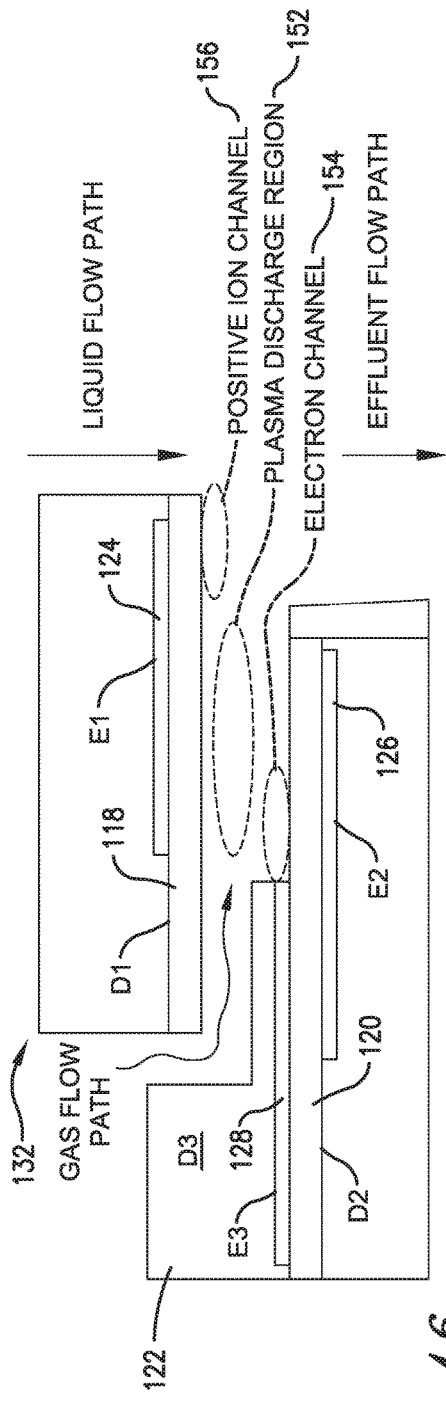
FIG. 16 is a schematic block diagram of the reactor chamber components of the plasma gate device of FIG. 14 illustrating a liquid flow path along a central longitudinal axis.

Another embodiment of the plasma gate device 100 is shown in FIGS. 14-16. The structure of the plasma gate device 100 is substantially similar to the structure of the plasma gate device 10 except that the plasma gate device 100 excludes the fourth electrode 30 and in its place is a liquid channel 188. The liquid channel 188 may receive a liquid, such as treated or untreated water, a liquid-state fuel, or the like. The plasma gate device 100 may be utilized to create an effluent which is a mixture of the source gas and the liquid. Applications for the plasma gate device 100 may include creating a nitrogen-enriched water that can be used as fertilizer, injection of oxygen ions for destruction of high molecular weight hydrocarbons (proteins and pharmaceuticals) in drinking water; and so forth.

The plasma gate device 100 also includes, among others, a first dielectric 118, a second dielectric 120, a third dielectric 122, a first electrode 124, a second electrode 126, a third electrode 128, a reactor chamber 132, a gas inlet connector 140, a gas bypass inlet connector 142, a first electrode connector 144, a second electrode connector 146, a third electrode connector 148, a plasma discharge region 152, an electron channel 154, a positive ion channel 156, and an effluent outlet 134—each of which is substantially similar in structure and operation to the like-named components of the plasma gate device 10.

The plasma gate device 100 operates and functions in a substantially similar fashion to the plasma gate device 10. Source gas flows through the gas inlet and into the reactor chamber 132. A liquid flows through the liquid channel 188 adjacent to the exit of the reactor chamber 132. The first and second electric power supplies 60, 66 supply voltages V1, V2, and V3, as shown in FIG. 13, to the electrodes 124, 126, 128. Resulting from the positive and negative voltage pulses, electrons are stripped from the source gas atoms and/or molecules—thereby creating a positive ion plasma. After the pulse, the electrons are attracted to the electron channel 154 adjacent to the third electrode 128 and may flow into the third electrode 128. The positive ion plasma may be both repelled by the second and third electrodes 126, 128 and attracted by the first electrode 124 to the positive ion channel 156. The positive ion plasma passes through the positive ion channel 156 and is injected into the path of the flowing liquid through the liquid channel 188. The plasma may bond with at least a portion of the liquid creating an effluent which may flow out of the liquid channel 188 and be directed to an external destination or target.

Figure 17:
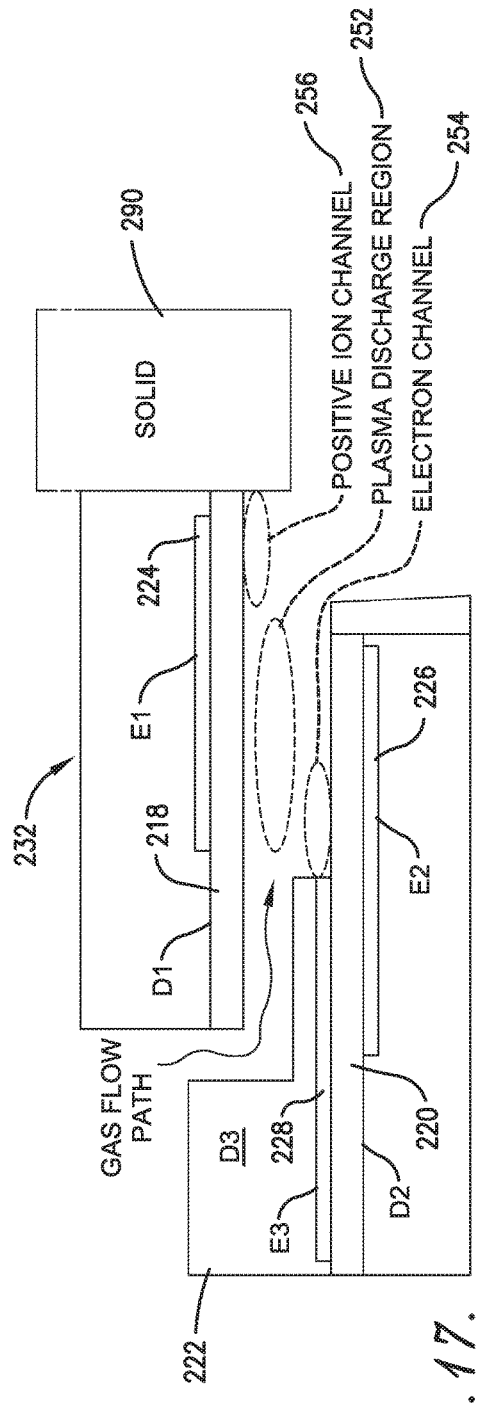
FIG. 17 is a schematic block diagram of the reactor chamber components of yet another embodiment of the plasma gate device illustrating a channel for solids along a central longitudinal axis.

Yet another embodiment of the plasma gate device 200 is shown in FIGS. 14, 15, and 17. The structure of the plasma gate device 200 is substantially similar to the structure of the plasma gate device 10 except that the plasma gate device 200 excludes the fourth electrode 30 and in its place is a solid channel 288. The solid channel 288 may receive a solid 290, which may include a flowable or plastic-state solid, a permeable film or screen, or the like. The plasma gate device 200 may be utilized to treat the surface of the solid. For example, if the solid is a metal, such as stainless steel, then the plasma gate device 200 may be used to apply a passivation layer to the surface. If the solid is a polymer that is used for 3D printing, then the plasma gate device 200 may inject ions into the polymer to improve adhesion or otherwise modify a character of the polymer.

The plasma gate device 200 also includes, among others, a first dielectric 218, a second dielectric 220, a third dielectric 222, a first electrode 224, a second electrode 226, a third electrode 228, a reactor chamber 232, a gas inlet connector 240, a gas bypass inlet connector 242, a first electrode connector 244, a second electrode connector 246, a third electrode connector 248, a plasma discharge region 252, an electron channel 254, a positive ion channel 256, and an outlet 234—each of which is substantially similar in structure and operation to the like-named components of the plasma gate device 10.

The plasma gate device 200 operates and functions in a substantially similar fashion to the plasma gate device 10. Source gas flows through the gas inlet and into the reactor chamber 232. The solid 290 may be in a flowable state such that it flows along the solid channel 288 or the solid 290 may be pushed or forced along the solid channel 288. The first and second electric power supplies 60, 66 supply voltages V1, V2, and V3 to the electrodes 224, 226, 228 as shown in FIG. 13. Resulting from the positive and negative voltage pulses, electrons are stripped from the source gas atoms and/or molecules—thereby creating a positive ion plasma. After the pulse, the electrons are attracted to the electron channel 254 adjacent to the third electrode 228 and may flow into the third electrode 228. The positive ion plasma may be both repelled by the second and third electrodes 226, 228 and attracted by the first electrode 224 to the positive ion channel 256. The positive ion plasma passes through the positive ion channel 256 and encounters the surface of the solid 290 as the solid 290 moves along the solid channel 288. The positive ion plasma may be injected into the solid 290 to improve adhesion of the solid material or may form a passivation layer at the surface of the solid 290.

Figure 18:
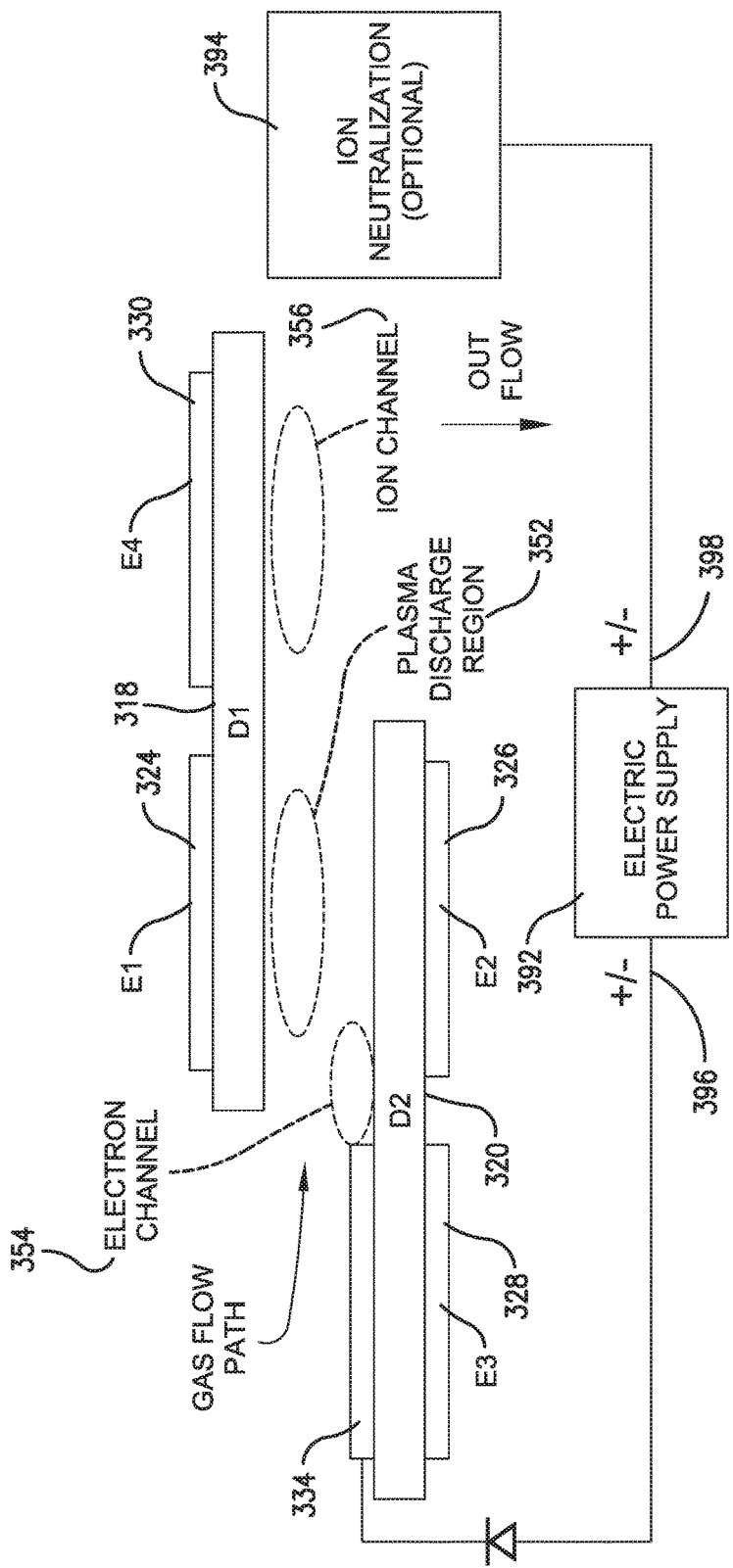
FIG. 18 is a schematic block diagram of the reactor chamber components of still another embodiment of the plasma gate device.

Another embodiment of the reactor chamber 332 and the components surrounding the reactor chamber 332 for a plasma gate device are shown in FIG. 18. The plasma gate device may also include a housing and connectors that are similar to those of the plasma gate devices 10, 100, 200. Alternatively, the reactor chamber 332 may be incorporated with any of the plasma gate devices 10, 100, 200 instead of the reactor chamber included with each of those devices 10, 100, 200. The components may include a first dielectric 318, a second dielectric 320, a first electrode 324, a second electrode 326, a third electrode 328, a fourth electrode 330, a fifth electrode 334, a plasma discharge region 352, an electron channel 354, an ion channel 356, an electric power supply 392, and an ion neutralization element 394.

The first and second dielectrics 318, 320 are each formed from non-conductive materials, such as plastics, ceramics, or other dielectric materials, with a high dielectric strength and a high electrical permittivity. In some embodiments, each dielectric 318, 320 may have a rectangular box shape. In other embodiments, each dielectric 318, 320 may be generally annular, disc-shaped with a central opening forming an inner diameter and a larger outer diameter. In all embodiments, each dielectric 318, 320 is formed to have an upper surface and a lower surface. The first dielectric 318 and the second dielectric 320 are positioned spaced apart from one another at opposing sides of the reactor chamber 332. In exemplary embodiments, the first dielectric 318 is positioned along the top of the reactor chamber 332, while the second dielectric 320 is positioned along the bottom of the reactor chamber 332. The lower surface of the first dielectric 318 faces the upper surface of the second dielectric 320. The first and second dielectrics 318, 320 are also positioned with their centers offset from one another such that a portion of the first dielectric 318 overlaps a portion of the second dielectric 320.

In alternative embodiments, the first and second dielectrics 318, 320 may each be split into two separate dielectric pieces such that there are four dielectrics. Two dielectrics may be positioned adjacent one another along the top of the reactor chamber 332, while two dielectrics may be positioned adjacent one another along the bottom of the reactor chamber 332.

The first through fifth electrodes 324, 326, 328, 330, 334 are each formed from electrically conductive material including metals. In some embodiments, each electrode 324, 326, 328, 330, 334 may have a rectangular box shape. In other embodiments, each electrode 324, 326, 328, 330, 334 may be generally annular, disc-shaped with a central opening forming an inner diameter and a larger outer diameter. The first electrode 324 is in contact with the upper surface of the first dielectric 318. The second electrode 326 is in contact with the lower surface of the second dielectric 320. The third electrode 328 is in contact with the lower surface of the second dielectric 320. The fourth electrode 330 is in contact with the upper surface of the first dielectric 318. The fifth electrode 334 is in contact with the upper surface of the second dielectric 320.

The first through fourth electrodes 324, 326, 328, 330, may be electrically connected to the first and second electric power supplies 60, 66 as shown in FIG. 10 and described above. The first and second electric power supplies 60, 66 may supply electric voltage and/or electric current as described above.

The plasma discharge region 352, the electron channel 354, and the ion channel 356 are all located in the reactor chamber 332 between the first dielectric 318 and the second dielectric 320.

The plasma discharge region 352 is positioned in the space where the first dielectric 318 and the second dielectric 320 overlap one another. In the plasma discharge region 352, a plasma of the source gas is created as a result of an electric field applied between the first electrode 324 and the second electrode 326. The plasma may have a positive charge or a negative charge. The electron channel 354 is positioned in the space adjacent to the fifth electrode 334 where electrons may be sourced from the fifth electrode 334 or flow into the fifth electrode 334. The ion channel 356 is positioned in the space adjacent to the fourth electrode 330 where the plasma may be attracted after it is created.

The electric power supply 392 includes a first terminal 396 and a second terminal 398 and may generate either a positive electric voltage or a negative electric voltage at each of the terminals 396, 398. The first terminal 396 is electrically connected through an optional diode to the fifth electrode 334, while the second terminal 398 is electrically connected to the ion neutralization element 394.

The ion neutralization element 394 is an optional component which may be an additional electrode or another material that can hold a charge. For example, the ion neutralization element 394 may hold a positive charge to attract and neutralize negative ions, or the ion neutralization element 394 may hold a negative charge to attract and neutralize positive ions.

The reactor chamber 332 may function as follows. The source gas flows into the space between the first and second dielectrics 318, 320. Electric voltages V1, V2, and V3 may be applied to the first through third electrodes 324, 326, 328 as shown in FIG. 13. The fourth electrode 330 may be electrically grounded or may receive approximately zero volts. The fifth electrode 334 may have a positive electric voltage or a negative electric voltage applied to it, depending on the charge of plasma to be created. For example, the fifth electrode 334 may have a positive electric voltage applied to it in order to sink electrons, or receive electrons, when a positive ion plasma is created. The fifth electrode 334 may have a negative electric voltage applied to it in order to source electrons, or supply electrons, when a negative ion plasma is created. As the positive and negative electric voltage pulses are applied to the second and first electrodes 326, 324 respectively, a large temporary electric field is generated between the electrodes 324, 326 in the plasma discharge region 352. The presence of the large electric field charges the plasma with a positive or negative charge depending on the electric voltage applied to the fifth electrode 334. After the pulses, the voltages V1 and V2 may return to DC values, which may differ from those shown in FIG. 13 in order to move the plasma toward the ion channel 356. At the ion channel 356, the plasma may flow out of the reactor chamber 332, may be used to treat the surface of a solid, may be injected into a liquid stream, etc. If the ion neutralization element 394 is utilized, then the plasma may be attracted to it and be neutralized.

A sequence of electric voltage pulses may be applied to the first and second electrodes 324, 326 to repeatedly generate plasma in a similar fashion to the plasma gate devices 10, 100, 200 described above. In between the pulses, DC voltages may be applied to the electrodes 324, 326.

Figure 19:
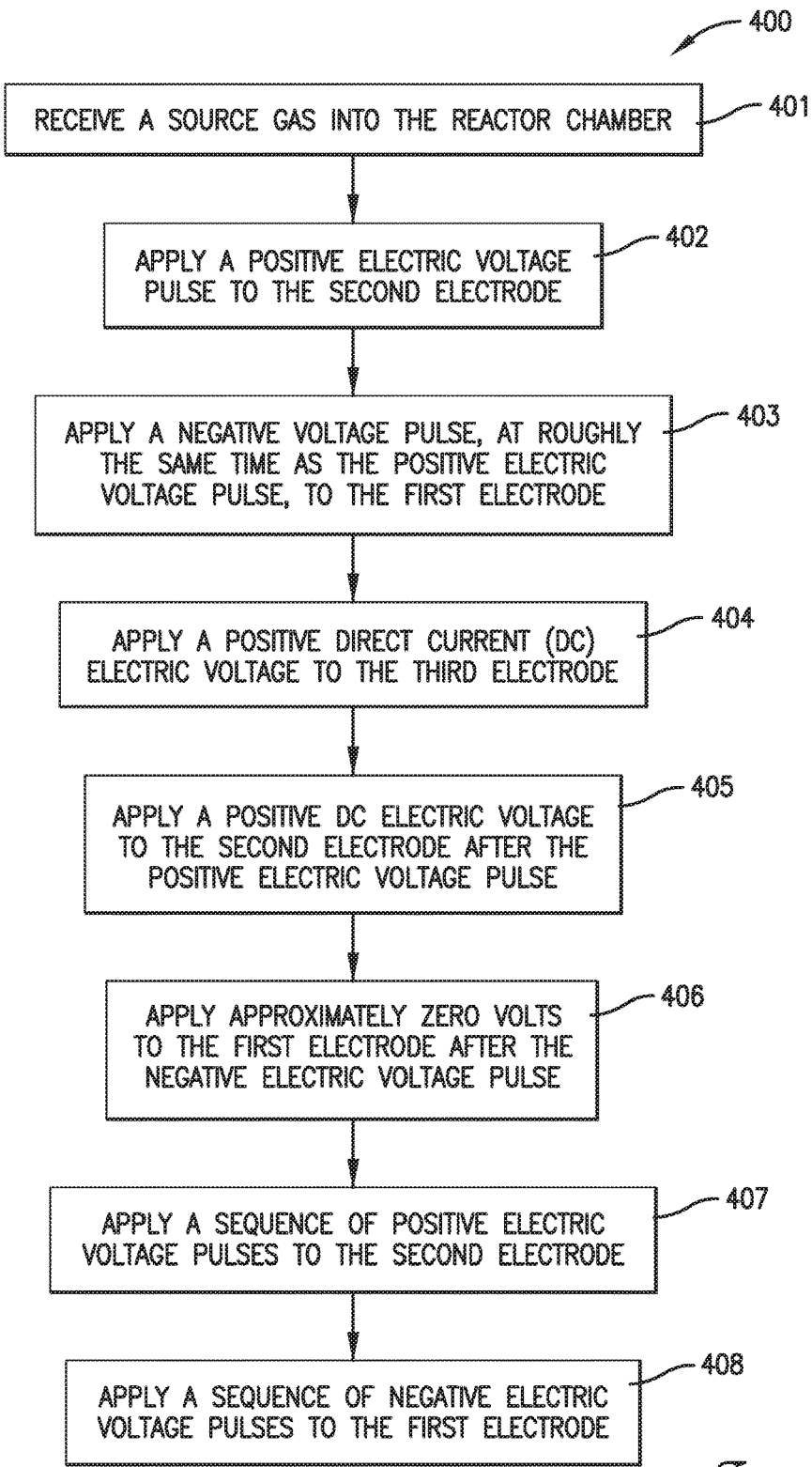
FIG. 19 is a listing of at least a portion of the steps of a method of operating a plasma gate device.

FIG. 19 depicts a listing of at least a portion of the steps of a method 400 of operating a plasma gate device 10. The steps may be performed in the order shown in FIG. 19, or they may be performed in a different order. Furthermore, some steps may be performed concurrently as opposed to sequentially. In addition, some steps may be optional or may not be performed. While the method 400 is discussed for operating the plasma gate device 10, the method 400 may also be applied to the plasma gate device 100 and the plasma gate device 200.

Referring to step 401, a source gas is received into the reactor chamber 32. The source gas may be a low density gas, such as oxygen, nitrogen, etc., or a gas mixture, supplied from an external source and received by the gas inlet 14 which allows the source gas to flow to the reactor chamber 32.

Referring to step 402, a positive electric voltage pulse is applied to the second electrode 26. The positive electric voltage pulse may be supplied from the first electric power supply 60. The electric voltage pulse may have a pulse width on the order of approximately 100 ns.

Referring to step 403, a negative electric voltage pulse is applied to the first electrode 24. The negative electric voltage pulse may be supplied from the first electric power supply 60 at roughly the same time as the positive electric voltage pulse. The electric voltage pulse may have a pulse width on the order of approximately 100 ns. During steps 402 and 403, the source gas may flow into the reactor chamber 32. The application of the positive and negative electric voltage pulses creates a large, but temporary, electric field pulse between the two electrodes 24, 26. The source gas is in the space of the reactor chamber 32 where the electric field 80 is created. The pulse of the electric field 80 may strip electrons off of the atoms and/or molecules of the source gas—resulting in the formation of a positive ion plasma and a cloud of free electrons.

Referring to step 404, a positive DC electric voltage is applied to the third electrode 28. The positive DC voltage may be supplied from the second electric power supply 66 and may be supplied before, during, or after the positive and negative electric voltage pulses are applied. The free electrons created by the electric field pulse are attracted to the third electrode 28 and may flow into the third electrode 28.

Referring to steps 405 and 406, a positive DC electric voltage is applied to the second electrode 26 after the positive electric voltage pulse, and approximately zero volts is applied to the first electrode 24 after the negative electric voltage pulse.

Referring to step 407, the actions of steps 402 and 405 are repeated as desired or indefinitely. A sequence of positive electric voltage pulses is applied to the second electrode 26. Between successive pulses, a DC voltage is applied to the second electrode 26. Each positive electric voltage pulse may have a pulse width on the order of approximately 100 ns. Successive positive electric voltage pulses may be applied at a rate of one every approximately 200 ns to approximately 1 ms.

Referring to step 408, the actions of steps 403 and 406 are repeated as desired or indefinitely. A sequence of negative electric voltage pulses is applied to the first electrode 24. Between successive pulses, approximately zero volts is applied to the first electrode 24. Each negative electric voltage pulse may have a pulse width on the order of approximately 100 ns. Successive negative electric voltage pulses may be applied at a rate of one every approximately 200 ns to approximately 1 ms.

Although the invention has been described with reference to the embodiments illustrated in the attached drawing figures, it is noted that equivalents may be employed and substitutions made herein without departing from the scope of the invention as recited in the claims.

Having thus described various embodiments of the invention, what is claimed as new and desired to be protected by Letters Patent includes the following:

1. A plasma gate device comprising:
   a housing including an internal reactor chamber;
   a gas inlet configured to receive a source gas that flows to the reactor chamber;
   a first dielectric and a second dielectric spaced apart from one another, each dielectric including an upper surface and a lower surface, the two dielectrics oriented such that the lower surface of the first dielectric faces the upper surface of the second dielectric, wherein the first dielectric forms an upper boundary of the reactor chamber and the second dielectric forms a lower boundary of the reactor chamber;
   a first electrode in contact with the upper surface of the first dielectric and a second electrode in contact with the lower surface of the second dielectric, the first electrode configured to receive a first electric voltage, the second electrode configured to receive a second electric voltage, the first and second electric voltages in combination generating an electric field in the reactor chamber through which the source gas flows creating a positive ion plasma and a cloud of electrons; and
   a third electrode in contact with a portion of the upper surface of the second dielectric and positioned outside the electric field, the third electrode configured to receive a third electric voltage to attract or emit the electrons.

2. The plasma gate device of claim 1, further comprising a fourth electrode positioned adjacent to the first dielectric, the fourth electrode configured to receive a fourth electric voltage which attracts the charged ion plasma.

3. The plasma gate device of claim 1, further comprising a liquid channel positioned adjacent to the first dielectric, the liquid channel configured to receive a liquid into which the charged ion plasma is injected.

4. The plasma gate device of claim 1, further comprising a solid channel positioned adjacent to the first dielectric, the solid channel configured to receive a solid whose surface receives the charged ion plasma.

5. The plasma gate device of claim 1, wherein each of the first and second dielectrics is annular, disc-shaped with a central opening.

6. The plasma gate device of claim 1, wherein each of the first and second electrodes is annular, disc-shaped with a central opening and a portion of the first electrode overlaps a portion of the second electrode such that the electric field is formed where the first electrode overlaps the second electrode.

7. The plasma gate device of claim 1, wherein the first electric voltage includes a sequence of negative electric voltage pulses and the second electric voltage includes a sequence of positive electric voltage pulses.

8. The plasma gate device of claim 7, wherein the negative electric voltage pulses and the positive electric voltage pulses each have a pulse width of approximately 100 nanoseconds.

9. The plasma gate device of claim 7, wherein the positive electric voltage pulses are applied at a rate of one every approximately 200 nanoseconds to approximately 1 millisecond.

10. The plasma gate device of claim 7, wherein the negative electric voltage pulses are applied at a rate of one every approximately 200 nanoseconds to approximately 1 millisecond.

11. A plasma gate device comprising:
    a housing including an internal reactor chamber;
    a gas inlet configured to receive a source gas that flows to the reactor chamber;
    a first electric power supply configured to supply a positive electric voltage pulse and a negative electric voltage pulse;
    a second electric power supply configured to supply a direct current (DC) voltage;
    a first dielectric and a second dielectric spaced apart from one another, each dielectric including an upper surface and a lower surface, the two dielectrics oriented such that the lower surface of the first dielectric faces the upper surface of the second dielectric, wherein the first dielectric forms an upper boundary of the reactor chamber and the second dielectric forms a lower boundary of the reactor chamber;
    a first electrode in contact with the upper surface of the first dielectric and a second electrode in contact with the lower surface of the second dielectric, the first electrode configured to receive the negative electric voltage pulse, the second electrode configured to receive the positive electric voltage, the positive and negative electric voltage pulses in combination generating an electric field in the reactor chamber through which the source gas flows creating a positive ion plasma and a cloud of electrons; and
    a third electrode in contact with a portion of the upper surface of the second dielectric and positioned outside the first electric field, the third electrode configured to receive the DC voltage to attract the electrons.

12. The plasma gate device of claim 11, further comprising a liquid channel positioned adjacent to the first dielectric, the liquid channel configured to receive a liquid into which the positive ion plasma is injected.

13. The plasma gate device of claim 11, further comprising a solid channel positioned adjacent to the first dielectric, the solid channel configured to receive a solid whose surface receives the positive ion plasma.

14. A method of operating a plasma gate device including a first electrode, a second electrode, a third electrode, and a reactor chamber in proximity to the electrodes, the method comprising:
  receiving a source gas into the reactor chamber;
  applying a positive electric voltage pulse to the second electrode;
  applying a negative electric voltage pulse, at roughly the same time as the positive electric voltage pulse, to the first electrode;
  applying a positive direct current (DC) electric voltage to the third electrode;
  applying a positive DC electric voltage to the second electrode after the positive electric voltage pulse; and
  applying approximately zero volts to the first electrode after the negative electric voltage pulse.

15. The method of claim 14, further comprising applying a sequence of positive electric voltage pulses to the second electrode and applying a sequence of negative electric voltage pulses to the first electrode, each successive positive electric voltage pulse applied at roughly the same time as a successive negative electric voltage pulse.

16. The method of claim 15, wherein between each successive positive electric voltage pulse, a positive DC electric voltage is applied to the second electrode.

17. The method of claim 15, wherein between each successive negative electric voltage pulse, approximately zero volts is applied to the first electrode.

18. The method of claim 15, wherein the positive electric voltage pulses are applied at a rate of one every approximately 200 nanoseconds to approximately 1 millisecond.

19. The method of claim 15, wherein the negative electric voltage pulses are applied at a rate of one every approximately 200 nanoseconds to approximately 1 millisecond.

20. The method of claim 14, wherein the negative electric voltage pulse and the positive electric voltage pulse each have a pulse width of approximately 100 nanoseconds.

* * * * *